(12) United States Patent
Wagner et al.

(10) Patent No.: US 11,107,763 B2
(45) Date of Patent: Aug. 31, 2021

(54) INTERCONNECT STRUCTURE FOR STACKED DIE IN A MICROELECTRONIC DEVICE

(71) Applicant: Intel Corporation, Santa Clara, CA (US)

(72) Inventors: Thomas Wagner, Regelsbach (DE); Andreas Wolter, Regensburg (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/469,113

(22) PCT Filed: Dec. 30, 2016

(86) PCT No.: PCT/US2016/069469
§ 371 (c)(1),
(2) Date: Jun. 12, 2019

(87) PCT Pub. No.: WO2018/125202
PCT Pub. Date: Jul. 5, 2018

(65) Prior Publication Data
US 2020/0020629 A1    Jan. 16, 2020

(51) Int. Cl.
*H01L 23/522* (2006.01)
*H01L 23/538* (2006.01)
*H01L 23/00* (2006.01)
*H01L 25/065* (2006.01)

(52) U.S. Cl.
CPC ...... *H01L 23/5226* (2013.01); *H01L 23/5383* (2013.01); *H01L 24/11* (2013.01); *H01L 24/13* (2013.01); *H01L 24/32* (2013.01); *H01L 24/83* (2013.01); *H01L 25/0657* (2013.01);
(Continued)

(58) Field of Classification Search
CPC combination set(s) only.
See application file for complete search history.

(56) References Cited

U.S. PATENT DOCUMENTS

2008/0099904 A1   5/2008  Chou et al.
2010/0276813 A1  11/2010  Belanger et al.
(Continued)

FOREIGN PATENT DOCUMENTS

DE  112016007578      10/2019
KR  1020100089040 A    8/2010
(Continued)

OTHER PUBLICATIONS

"International Application Serial No. PCT/US2016/069469, International Search Report dated Sep. 21, 2017", 3 pgs.
(Continued)

*Primary Examiner* — Ratisha Mehta
(74) *Attorney, Agent, or Firm* — Schwegman Lundberg & Woessner, P.A.

(57) ABSTRACT

A microelectronic package includes at least two semiconductor die, one die stacked over at least partially another. At a least the upper die is oriented with its active surface facing in the direction of a redistribution structure, and one or more wires are coupled to extend from contacts on that active surface into conductive structures in the redistribution structure.

25 Claims, 8 Drawing Sheets

(52) U.S. Cl.
    CPC .......... *H01L 2224/0231* (2013.01); *H01L 2224/02331* (2013.01)

(56) References Cited

U.S. PATENT DOCUMENTS

| | | | |
|---|---|---|---|
| 2011/0278707 A1* | 11/2011 | Chi | H01L 24/97 257/676 |
| 2013/0001773 A1 | 1/2013 | Cho et al. | |
| 2013/0037950 A1* | 2/2013 | Yu | H01L 23/3121 257/738 |
| 2014/0264817 A1* | 9/2014 | Lee | H01L 23/49822 257/712 |
| 2015/0001709 A1 | 1/2015 | Bao et al. | |
| 2015/0279819 A1 | 10/2015 | Lee | |

FOREIGN PATENT DOCUMENTS

| | | |
|---|---|---|
| TW | 201841321 A | 11/2018 |
| WO | WO-2016049940 A1 | 4/2016 |
| WO | WO-2018/125202 | 7/2018 |

OTHER PUBLICATIONS

"International Application Serial No. PCT/US2016/069469, Written Opinion dated Sep. 21, 2017", 10 pgs.
"International Application Serial No. PCT US2016 069469, International Preliminary Report on Patentability dated Nov. 17, 2019", 12 pgs.
"Taiwanese Application Serial No. 106139465, Office Action dated Dec. 31, 2020", w English Translation, 14 pgs.

* cited by examiner ly to methods and apparatus for providing interconnections in microelectronic devices; and more particularly relate to methods and apparatus for providing interconnections between one or more stacked die and a redistribution structure in a microelectronic device.

INTERCONNECT STRUCTURE FOR STACKED DIE IN A MICROELECTRONIC DEVICE

PRIORITY APPLICATION

This patent application is a U.S. National Stage Application under 35 U.S.C. 371 from International Application No. PCT/US2016/069469, filed Dec. 30, 2016, published as WO 2018/125202, which is incorporated herein by reference in its entirety.

TECHNICAL FIELD

Embodiments described herein relate generally to methods and apparatus for providing interconnections in microelectronic devices; and more particularly relate to methods and apparatus for providing interconnections between one or more stacked die and a redistribution structure in a microelectronic device.

BACKGROUND

Many forms of microelectronic devices such as IC (integrated circuit) packages include one or more semiconductor die (also, referred to herein as "die"), coupled to a redistribution structure adapted to facilitate interconnections with other devices (for example, a printed circuit board, such as a motherboard, or another modular assembly). For many types of devices, vertically stacking of the die helps reduce the lateral (X-Y dimension) size of the package at the expense of increased height (Z-dimension) of the package. Such a redistribution structure may include one or more layers, each layer including conductive traces and vias to connect, directly or indirectly, with respective contacts on one or more semiconductor die to redistribute the die contacts to other locations. In the case of "fan-out" packages, the redistribution structure may include electrical traces arranged to redistribute at least a portion, or all, of the contacts on a die to contact locations outside the lateral dimensions of the semiconductor die itself (the 'footprint" of the die).

Different structures are known for providing electrical communication between the stacked die in a package and a redistribution structure before. One common structure is a lower structure (either a semiconductor die or an interposer) underlying the stacked die and having through silicon vias (TSVs) providing electrical connections between the stacked die and the redistribution structure. Such structures can be complex and costly to manufacture, however. Conventional systems for providing a direct electrical connection between a stacked die and a supporting structure may commonly require additional height (Z dimension) above the uppermost stacked die to accommodate the electrical connecting structure. In other proposed systems, if the connecting structures do not require additional height above the stacked die, the connecting structures may extend only to the proximal surface of the supporting structure.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As noted above, many conventional systems for connecting one or more stacked die in a microelectronic device package with a redistribution structure of the package require additional height in the package above the uppermost stacked die, or can only extend to the surface of the redistribution structure to make connection therewith. Example structures as described herein may provide flexibility in the arrangement of a die stacked over another die, and/or enable optional configurations for connecting the stacked die with the redistribution structure. In examples as described herein, the die stacked over another die can extend only partially above the lower die or can extend completely over and beyond the footprint of the lower die (in at least one of the X-Y lateral dimensions). The upper die may be placed with its active surface facing in the direction of the redistribution structure, and one or more wires may be coupled to contacts on that active surface, and may extend into respective conductive structures in the redistribution structure.

As used herein, the term "redistribution structure" is used to refer collectively to the multiple material levels (for example, two layers of dielectric on opposite sides of a metal or other conductive material layer) which collectively form conductive traces and interconnects (commonly in the form of conductive vias, such as micro-vias) to collectively redistribute the contacts of the semiconductor die to desired locations and spacing to facilitate attachment to external structures, and also to the contacts (such as contact balls), formed thereon. The term contemplates redistribution structures having either a single layer of metal (or another conductor) traces, or multiple layers of metal (or another conductor) traces, vertically offset from one another and insulated from one another.

The examples herein describe a microelectronic device incorporating a fan-out redistribution structure which extends beyond the footprint of one or more of the die connected directly to the redistribution structure. In these example configurations, the redistribution structure is supported in part by a molded component encapsulating the die of the microelectronic device. In these examples, the redistribution structure is formed after encapsulating of the die within the microelectronic device.

Figure 1:
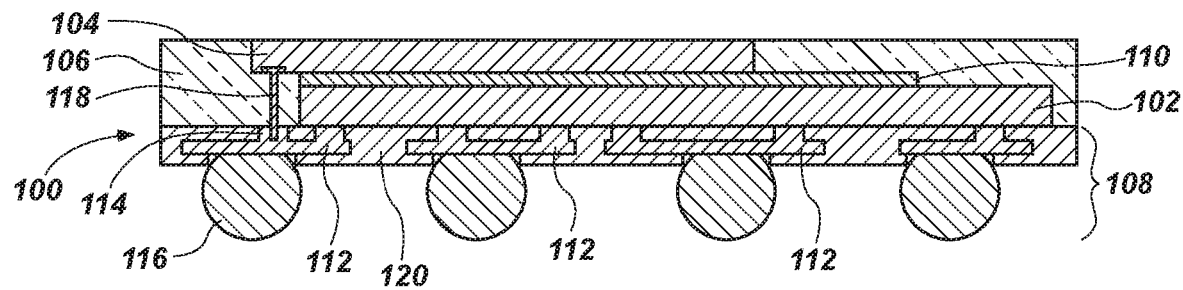
FIG. 1 depicts a cross section of a schematic representation of an example microelectronic device package having stacked semiconductor die, and incorporating the techniques and structures described herein.

Referring now to FIG. 1, the figure depicts a cross-section of a schematic representation of an example microelectronic device 100 in accordance with the present description. Microelectronic device 100 includes a first semiconductor die 102, with a second semiconductor die 104 stacked to extend partially over die 102. First semiconductor die 102 and second semiconductor die 104 are, in this example, coupled together such as through an adhesive layer, as indicated at 110. The semiconductor die 102, 104 are encapsulated within a molded component 106. In the depicted example, the uppermost ("backside") surface of second semiconductor die 104 is exposed, and molded component 106 extends around the perimeter of second semiconductor die 104. In other examples, second semiconductor die 104, and any other additional die which may be in the microelectronic device, may be completely contained within the molded component. In other examples, for devices such as the example microelectronic device 100 when the backside of a semiconductor die is exposed, an additional backside protection material or structure may be provided over such die, and potentially over at least some portion of molded component 106.

A redistribution structure, indicated generally at 108, is supported by first semiconductor die 102 and molded component 106. Redistribution structure 108 includes a metallization layer, defining conductive traces, examples of which are identified at 112, and conductive vias, examples of which are identified at 114. The conductive traces 112 and vias 114, are retained within a dielectric structure 120. Some conductive traces 112 form contact pads to support contacts, such as solder balls 116, to provide electrical connection with external structures (such as a motherboard or other supporting structure). In the depicted example, conductive traces make direct connection with contact locations on an active surface of first semiconductor die 112 through conductive micro-vias formed directly on the first semiconductor die. The second semiconductor die 104 is oriented with its active surface oriented to face redistribution structure 108. Contacts on the active surface of second semiconductor die 104 directly connect with a respective conductive structure in redistribution structure 108 through interconnects formed of wires 118 which extend into such conductive structures (such as micro-vias 114). As will be described in more detail later herein wires 118 can be placed on second semiconductor die 104 through conventional wire bonding techniques. Additionally, in many examples, respective conductive structures of redistribution structure 108 may be formed to extend around an end portion of each wire 118.

Figure 2A:
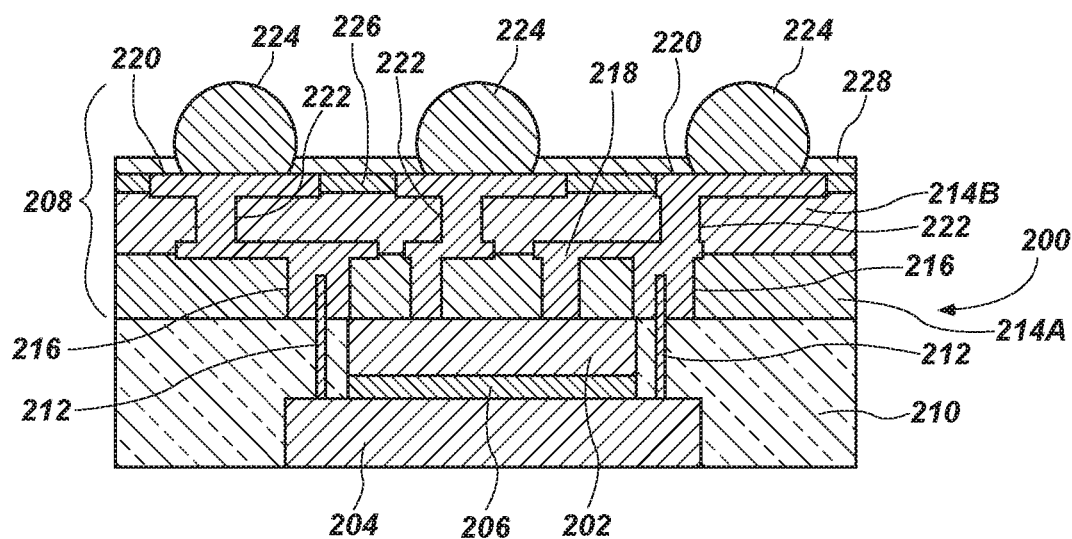
FIGS. 2A-C depict cross-sectional schematic representation of alternative configurations of example microelectronic device packages incorporating the techniques and structures described herein; in which FIGS. 2B and 2C each depict design alternatives to the microelectronic device package of FIG. 2A.
Figure 2B:
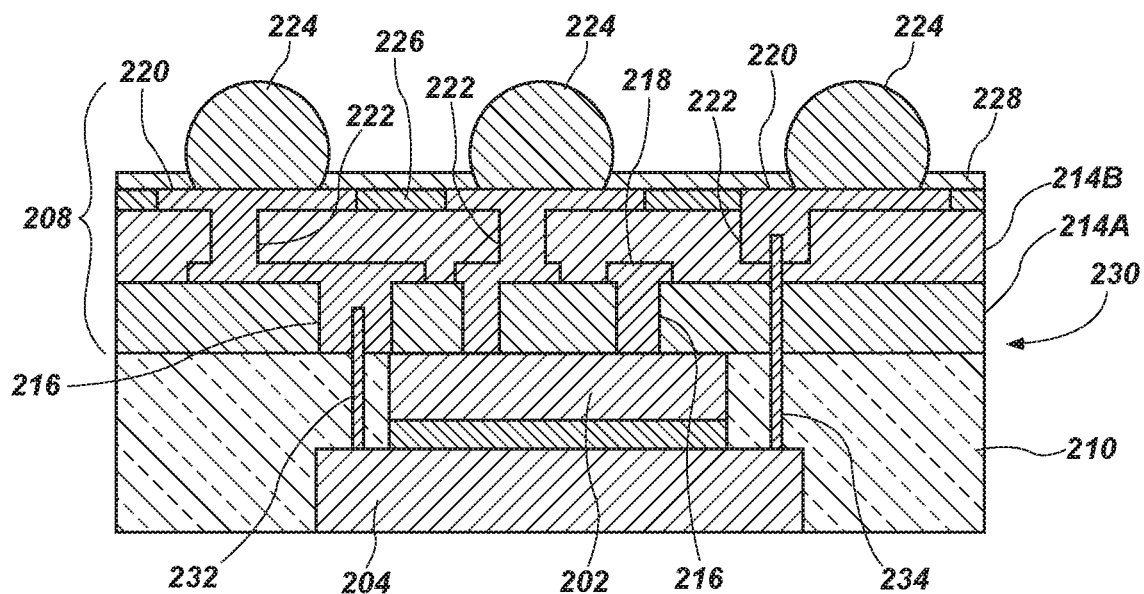
Figure 2C:
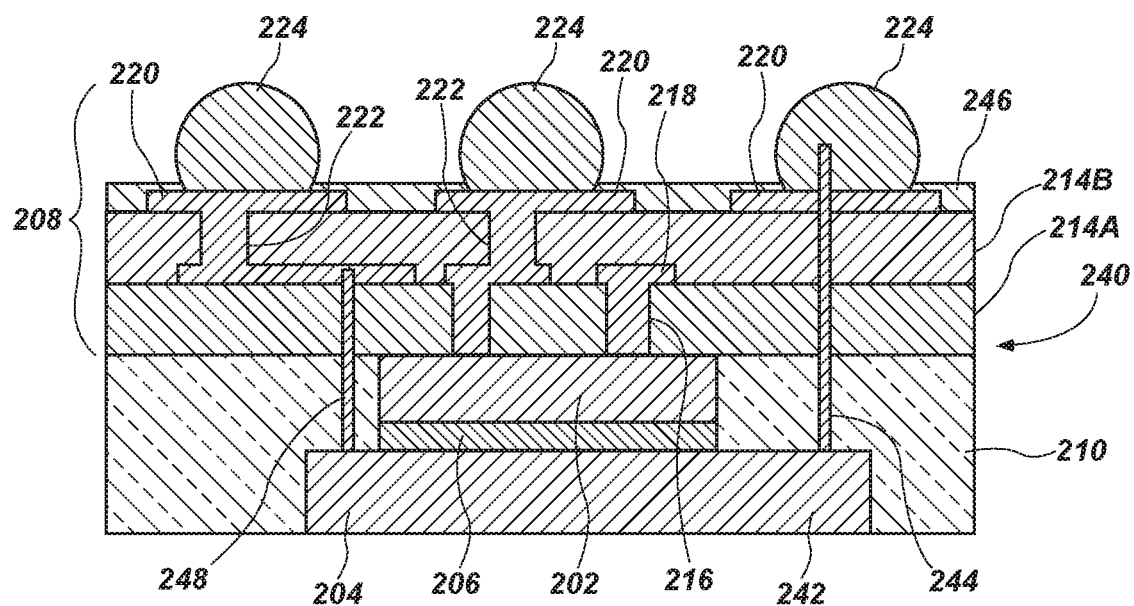

Referring now to FIGS. 2A-C, the figures each depict a cross-sectional schematic representation of an example alternative configuration of a microelectronic device in accordance with the present description. Referring first to FIG. 2A, example microelectronic device 200 includes a first semiconductor die 202 with a second (stacked) semiconductor die 204 stacked over die 202 and coupled thereto by an adhesive layer 206. The first and second die 202, 204 are retained within a molded component 210. A redistribution structure 208 has been formed on first semiconductor die 202 and molded component 210. In the example of microelectronic device 200, the second semiconductor die 204 extends (at least in one of the X-Y dimensions) completely across the width of first semiconductor die 202. As a result, wires 212 extend from stacked semiconductor die 204 on both sides of first semiconductor die 202. As noted with respect to FIG. 1, each wire 212 extends into a respective conductive structure in redistribution structure 208. In various examples, each wire may extend to contact and terminate within any respective conductive structure in redistribution structure 208, including for example, a conductive trace, a micro-via, and a contact ball. In the depicted example, each wire 212 extends into a respective micro-via 216 in the first, lowermost, layer of a multilayer redistribution structure having first and second layers of conductive traces 218, 220, within a respective dielectric layer 214A, 214B. Individual conductive traces 218 of the first layer are connected to individual conductive traces 220 of the second layer through micro-vias 222. The conductive traces 220 of the second layer extend to form contact pads for supporting solder balls 224. One or more dielectric layers may be formed between and over the conductive traces 220 of the second layer, as depicted at 226 between the conductive traces 220, and as depicted at 228 over the conductive traces 220 which include surfaces forming contact pads. In some examples, outermost dielectric 228 may be a solder resist layer. In other examples (and as depicted in FIG. 2C), a single dielectric material, which may be a solder resist layer, may be formed between and over the conductive traces 220.

Referring now to FIG. 2B, the figure depicts an alternative structure of microelectronic device 230. The basic structure of microelectronic device 230 is directly analogous to that of microelectronic device 200 of FIG. 2A, and thus corresponding elements are numbered similarly, and except as noted below, the description accompanying FIG. 2A is applicable to microelectronic device 230. Where microelectronic device 230 differs from microelectronic device 200 is that while a first wire 232 extends into a conductive structure in the first layer of redistribution structure 208 (in the depicted example into via 216), a second wire 234 which is longer than wire 232, extends from second semiconductor die 204 directly into a conductive structure in the second layer of redistribution structure 208 (in the depicted example micro-via 222). Thus, second semiconductor die may be coupled directly through wires of different lengths to a desired vertically offset locations in redistribution structure. This facilitates the stacked, second semiconductor die to communicate directly with a desired node in the redistribution structure without having to traverse all levels of the redistribution structure. In other examples, redistribution structure might have three, four, or more conductive layers, and individual wires may be formed with a length to extend into any desired conductive structure in the redistribution structure (for example, conductive traces, conductive micro-vias, contact pads) in any one of such layers of the redistribution structure; or may extend all the way through the redistribution structure layers to extend beyond a contact pad and into a contact ball.

Referring now to FIG. 2C, the figure depicts an alternative structure of microelectronic device 240. The basic structure of microelectronic device 230 is directly analogous to that of microelectronic devices 200 and 230 of FIGS. 2A-B, and thus corresponding elements are numbered similarly, and except as noted below, the description accompanying FIG. 2A is applicable to microelectronic device 240. As identified above, the wires may extend into any conductive structure of redistribution structure 208, including any of the conductive traces, vias (or micro-vias) or contact balls. Example microelectronic device 240, includes a first wire 244 extending from second (stacked) die 242, and through a contact pad formed in a conductive trace 220, to extend into a contact ball 224 formed on the conductive trace 220. Thus a direct communication is established between die 242 and a contact ball 224 of microelectronic device 240. Microelectronic device 240 also includes another wire 248 extending from die 242, which terminates within a conductive trace, in this example, a conductive trace 218 of the first conductive layer of redistribution structure 208. Also, as noted earlier herein, in microelectronic device 240 a single layer of dielectric material 246 extends between and over the upper layer of conductive traces 220. Any of a variety of possible materials may be utilized for this dielectric layer 246; for instance, some examples may use a solder resist material for dielectric material 246.

The example structures of any of FIGS. 2A-C, are illustrative only, and it should be understood that any one or more of the described connections of wires of the stacked die with the various conductive structures within redistribution structure 208 may be utilized for individual wires in a microelectronic device. Any such microelectronic device may include multiple wires, each of which may connect with any desired conductive structure in a redistribution structure. In some examples, wires may each terminate within a conductive structure with which they make contact. However in some cases a wire may contact and extend through a conductive structure to make contact with yet another conductive structure (see for example FIG. 2C, in which wire 244 extends through a conductive trace 220 and terminates in a contact ball 224.

Figure 3A:
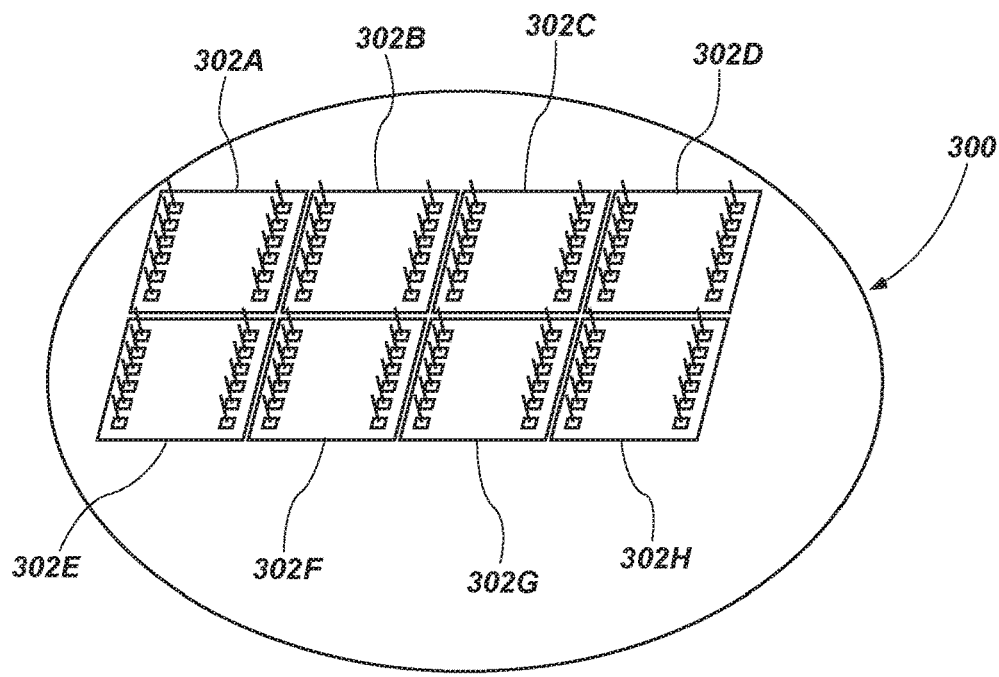
FIGS. 3A-C depicts example configurations for forming a die for stacking in accordance with either of the example configurations of FIGS. 2A-C.
Figure 3B:
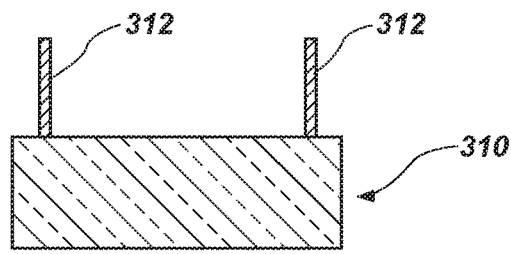
Figure 3C:
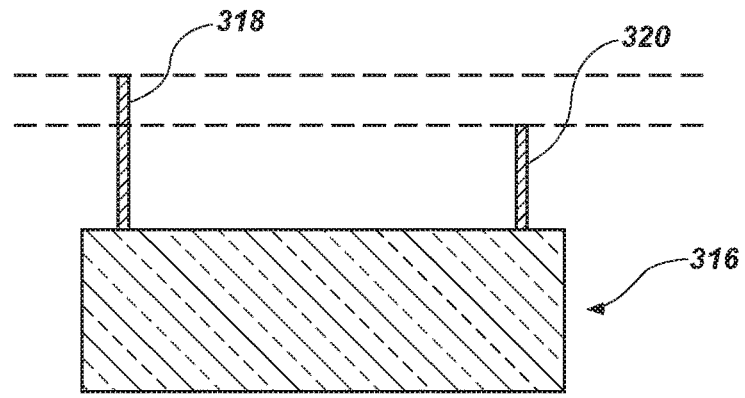

Referring now to FIGS. 3A-C, the figures depict example configurations for forming a die for stacking in accordance with either of the example configurations of FIGS. 2A-C. FIG. 3A depicts a schematic representation of a wafer 300 having multiple semiconductor die sites 302A-H formed thereon. Each die site 302A-H includes two spaced groups of contact surfaces on an active surface of each die site. In the depicted example, the contact surfaces are arranged in rows proximate opposite edges of each die site, with each contact surface having a respective wire extending therefrom, that will form a respective interconnect. Though for example purposes only a single row of contact surfaces with an attached wire is depicted on each side of each die site 302A-H, contact surfaces with attached wires may be arranged in multiple rows and/or in any other desired arrangement on a die site. In many examples, each wire may be coupled to a respective contact surface through conventional wire bonding techniques, and the wire may be a conventional wire bond wire. Such wire bond wire may be formed of copper or another metal, such as gold, silver, or a mixed alloy; and may any suitable diameter. In some examples, the wires may be expected to have a diameter in the range of approximately 10 to 30 µm.

Each wire is formed to extend generally away from the active surface of each die site. In many examples, the wires may extend essentially perpendicular to the contact surface to which the wire is attached (and the surface supporting the contact surface). The length of each wire for any respective die will be dependent upon the Z-dimension of the base level die and any additional die that will be placed beneath such die, any material that will extend over the base level die (such as an adhesive layer to secure the stacked die), and the vertical dimension within a redistribution structure to which the wire should extend. For example, in some example constructions, each layer of the redistribution structure may have a Z dimension of approximately 10 µm to 15 µm. In some example implementations of the structures generally described herein, individual wires may be expected to have a length within the range of 50 µm to 300 µm. Once the wires have been attached, the individual die sites may be singulated such as through use of a wafer saw, laser cutting, etc. to define individual die.

FIG. 3B depicts a first configuration of a die 310 in which wires 312 on each side of the die have essentially the same length. The length of wires 312 may be selected to facilitate incorporation of the die in a microelectronic device such as microelectronic device 200 of FIG. 2A. In contrast, FIG. 3C depicts an alternative configuration of a die 316, in which wires 318 on a first side of die 316 are longer than wires 320 on the opposite side of die 316. Thus, die 316 may be suitable for use in a structure such as microelectronic device 230 of FIG. 2B, or microelectronic device 240 of FIG. 2C, wherein the wires are formed of different lengths to facilitate extending into different layers of a redistribution structure. (including potentially the contact balls of the redistribution structure).

Figure 4:
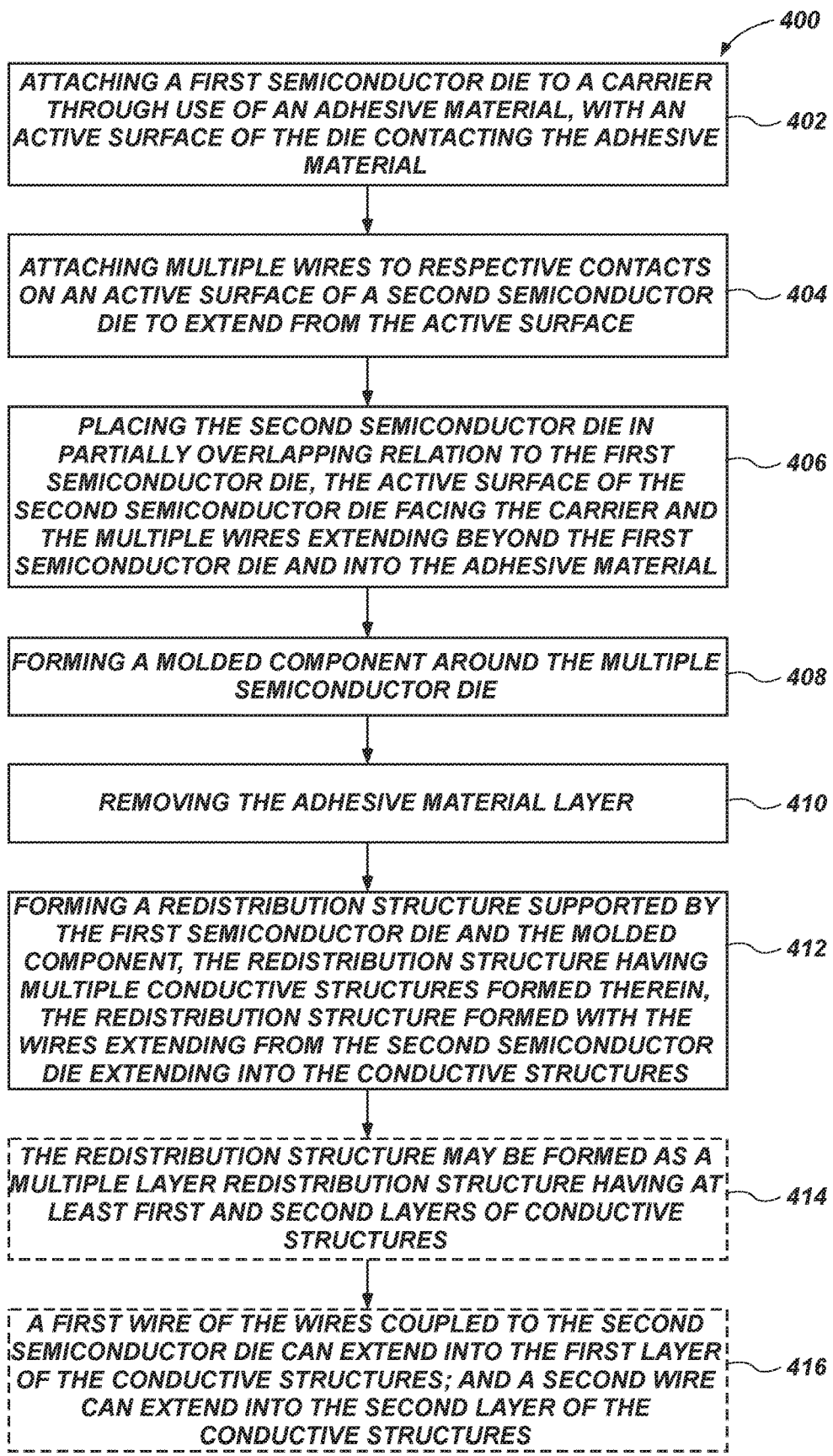
FIG. 4 depicts a flowchart of an example process flow for forming a microelectronic device package such as that of any of FIG. 1 or 2A-C.

Referring now to FIGS. 4 and 5, FIG. 4 depicts a flowchart of an example process flow for forming a microelectronic device package (such as that of any of FIG. 1 or 2A-B); and FIG. 5 depicts example stages during forming a microelectronic device. As indicated at 402, the process can be initiated by attaching a first semiconductor die to a carrier through use of an adhesive material, with the semiconductor die oriented with the active surface of the die contacting the adhesive material. This can be an initial stage in "reconstitution" of a wafer. As an example of such reconstitution of a wafer, as known to persons skilled in the art, individual singulated die are placed on a mold carrier in spaced relation to one another, the spacing selected to provide an intended dimension for accommodating a redistribution layer of a selected dimension to be formed relative to each die, and to accommodate subsequent singulation of the redistribution layers and supporting molded structure (with attached die). FIG. 5A depicts a carrier 502 having an adhesive material 504 formed thereon, and a first semiconductor die 506 placed on the adhesive material in the manner described. In some examples, the carrier 502 may be a mold carrier which will receive a molding compound, as described later herein. In some examples, the carrier 502 may be a surface, such as a metal, glass or silicon surface.

As indicated at 404, the example process flow also includes attaching multiple wires to respective contacts on an active surface of a second semiconductor die to extend from the active surface. The example of FIG. 3A, discussed above, provides one example structure for performing this operation. In other examples, the wires may be coupled to die which have already been singulated from one another rather than being in wafer form as discussed relative to FIG. 3A.

Figure 5A:
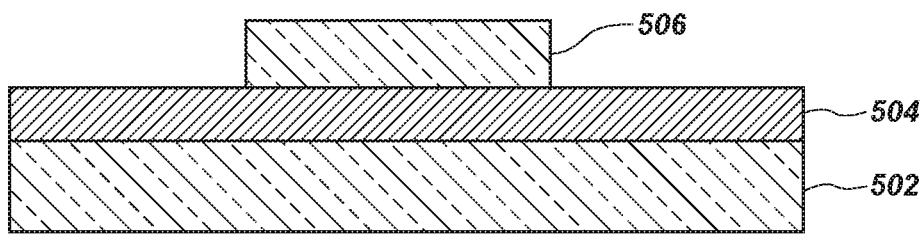
FIGS. 5A-I depict example microelectronic device configurations at different stages during a manufacturing process, such as the example process flow of FIG. 4.
Figure 5B:
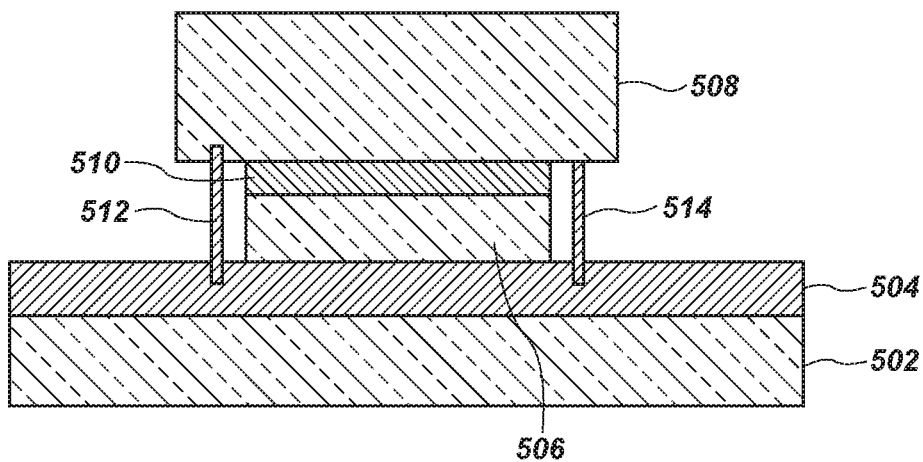

As indicated at 406, the second semiconductor die is placed in at least partially overlapping relation to the first semiconductor die, with the active surface of the second semiconductor die facing the carrier, and with the multiple wires extending beyond the first semiconductor die and into the adhesive material. FIG. 5B depicts the structure of FIG. 5A after placement of a second semiconductor die 508 in the described manner, with wires 512, 514 extending into adhesive material 504. In the depicted example, wires 512 and 514 extend into adhesive material 504 for substantially the same distance.

Figure 5C:
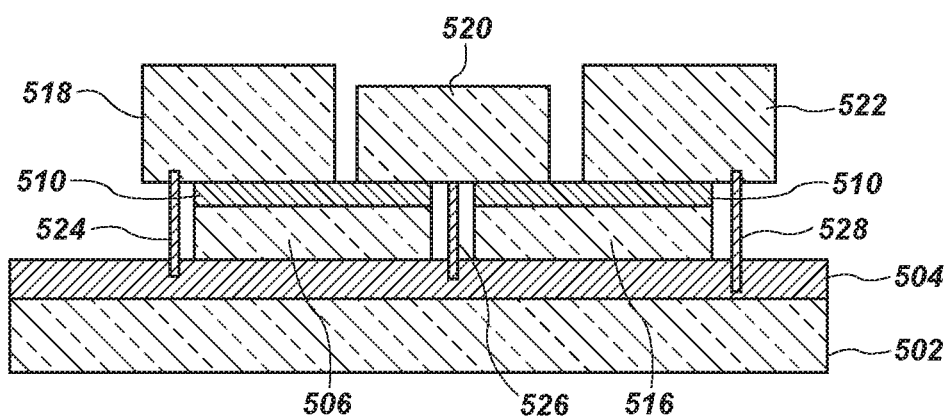

For simplicity of explanation, the example process flow 400 of FIG. 4 describes stacking of only one die over another. However, many other configurations are possible including additional three or more levels of stacked die and/or different arrangements of die. An example alternative configuration is depicted in FIG. 5C, wherein an additional die 516 is placed in a flip chip placement adjacent the first semiconductor die 506; and multiple die are placed in another level above the flip chip die 506, 516. In this example, additional die 518, 520, 522 are placed in a second level of die, and each includes one or more respective wires, 524, 526, 528, respectively, extending into adhesive material 504. Analogous to the above discussion of FIG. 5B, he can be seen that the wires 528 extending from die 522 extend into adhesive material 504 for a greater distance than do the groups of wires 524, 526 coupled to semiconductor die 518, 520, respectively. Additionally, it should be understood that not all wires on a die or on either side of the die need to be of the same length. For example, in any group of wires connected to a die for use as described herein, wires in any group may be of different lengths to facilitate extending to desired attachment sites within multiple layers within a redistribution structure.

Figure 5D:
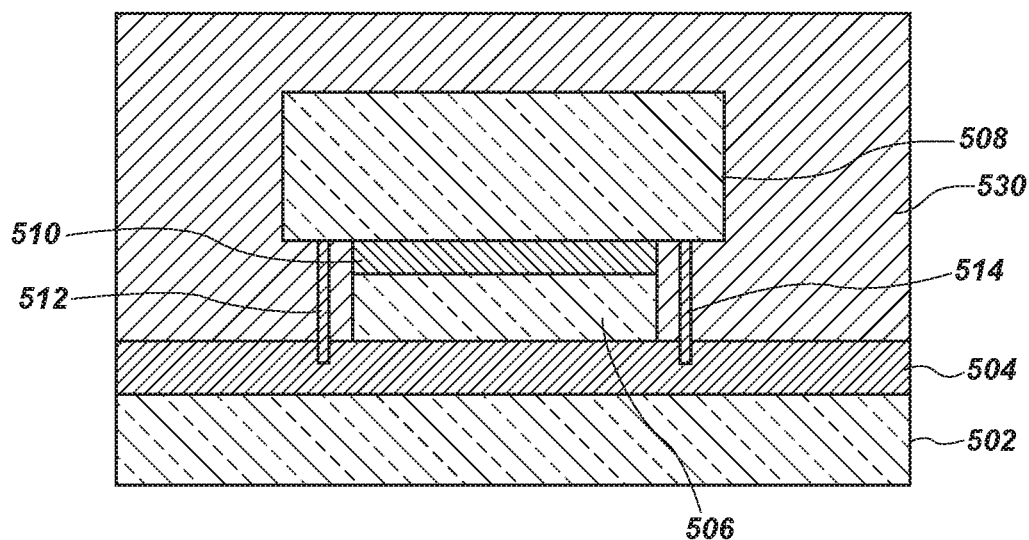

Referring again to FIG. 4, as indicated at 408, a molded component may be formed, such as through use of an encapsulant formed around the multiple semiconductor die. In some examples, forming the molded component may include placing a molding compound in the mold carrier and subjecting the molding compound to appropriate conditions to surround the die of each microelectronic device and to solidify. The molded components will extend to the required dimension to accommodate the die and additional lateral dimensions needed for the fan-out of the pin out of the die within the device. FIG. 5D depicts the structure of FIG. 5B after forming of the molded component 530.

Figure 5E:
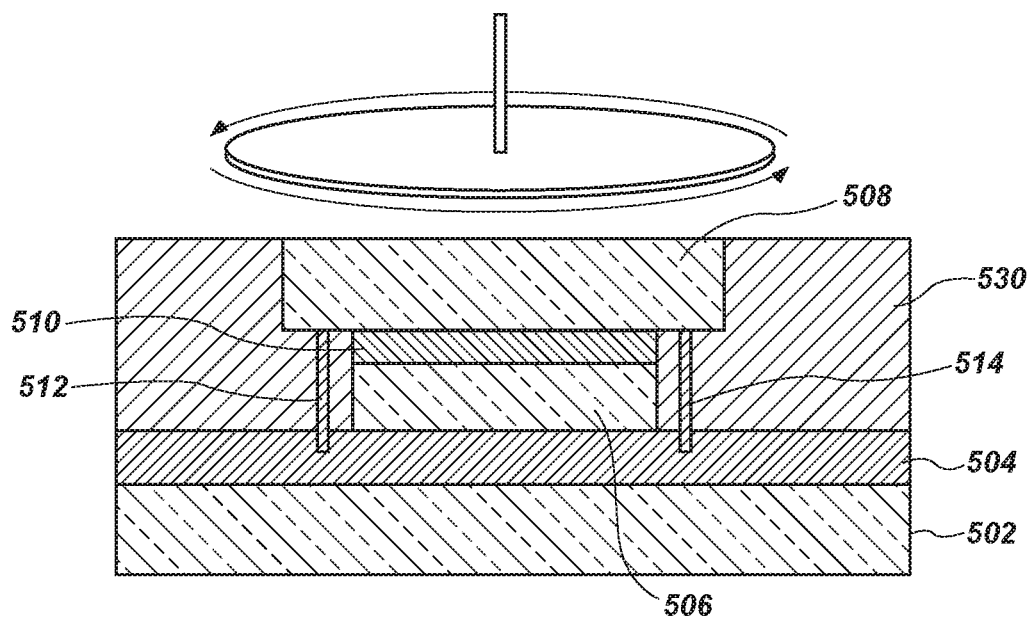

Once the molded components is formed, an optional operation may be to back grind the molded component and one or more of the semiconductor die to reduce the vertical dimension of the package (and potentially of the individual stacked die, by removing non-active portions of the stacked die). This optional operation is depicted at FIG. 5E, showing the reduced dimension of molded component 530 and of die 508 resulting from such back grinding. In some examples, if the Z-dimension of the stacked die is not problematic, a molding process utilizing a dedicated mold tool may be used to form the molded component around the uppermost stacked die, leaving the uppermost surface of the one or more upper die exposed (as depicted in FIG. 1).

Figure 5F:
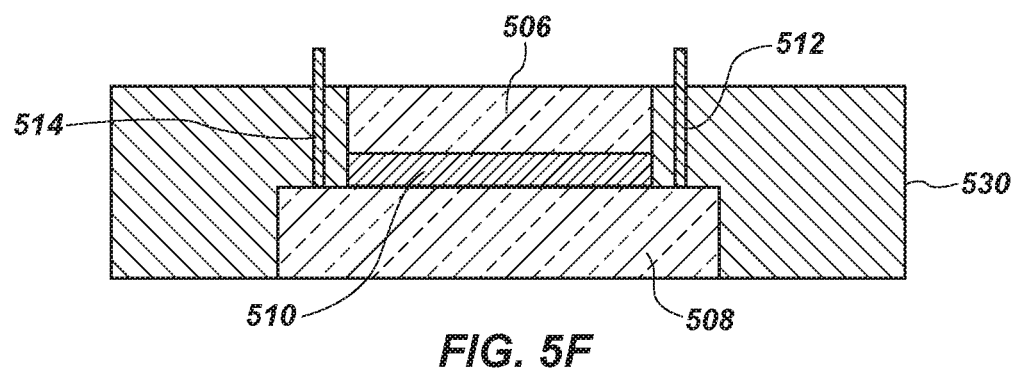

Referring again to FIG. 4, as indicated at 410 the adhesive material layer (504 in FIGS. 5A-E) may be removed from the reconstituted wafer, along with the carrier 502. As shown in FIG. 5F, removal of the adhesive material layer will leave wires 512, 514 extending beyond the outermost surface of first semiconductor die 506 and of molded component 530.

As indicated at 412, a redistribution structure may then be formed that is supported by the first semiconductor die and the molded component. The redistribution structure will have multiple conductive structures, with the wires extending from the second semiconductor die extending the end of the conductive structures. In many examples, the conductive structures may be expressly formed around at least the end portion of the wires.

Figure 5G:
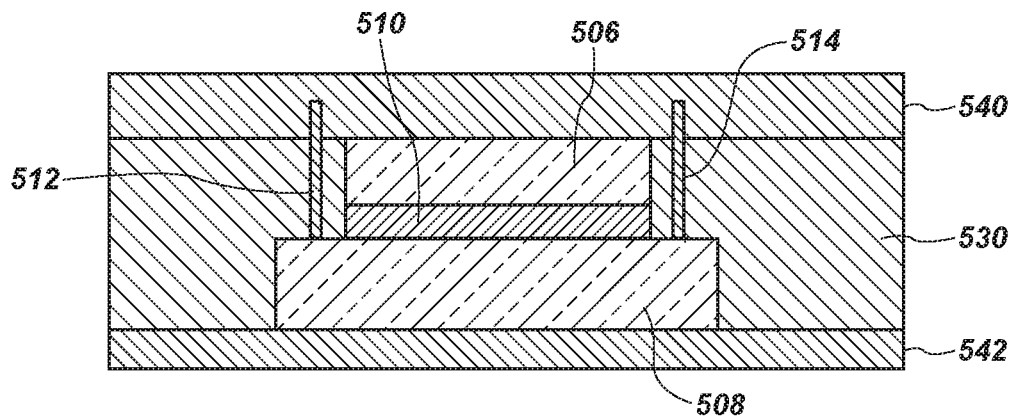

In an optional process operation, as indicated at 414, the redistribution structure may be of multiple layer redistribution structure having at least first and second layers of conductive structures. The formation of such a multiple layer redistribution structure is further described in reference to FIGS. 5G-I. As one example method of forming the redistribution structure, a first dielectric layer may be formed over the surface of the first semiconductor die 506 and the molded component 530. An example structure is depicted in FIG. 5G in which first dielectric layer 540 has been formed. In some example processes, such as where the die within the device and/or the molded component are relatively thin, it may be desirable to attach the backside of the reconstituted wafer to a carrier (as indicated at 542 in FIG. 5G) to ease handling of the wafer during formation of the redistribution structure. First dielectric layer 540 can any of various appropriate materials. In some examples, first dielectric layer may include a polyamide material which, in some examples may be deposited across the entire surface of the reconstituted wafer.

Figure 5H:
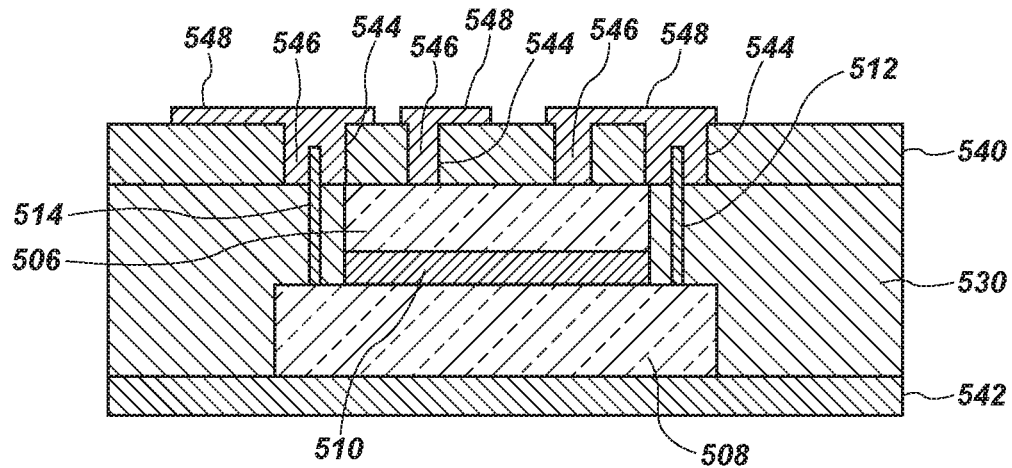

Once first dielectric layer 540 has been formed, photolithographic patterning and etching may be used to define openings 544 for housing micro-vias that may connect with contacts on the active surface of die 506 as well as with wires 512, 514. FIG. 5H depicts the structure of a first layer of a multilayer redistribution structure is may be formed by the following operations.

Once openings 544 for the micro-vias have been defined, a first conductive layer, such as a metal layer (in many cases a copper layer) can be deposited in the openings and over the surface of the first dielectric layer 540. In example processes in which the metal layer is copper, electrochemical plating may be used to form the copper micro-vias 546 and conductive traces 548. In some example processes, a seed layer can be deposited within the openings and on the exposed surface of first dielectric layer 540. In some examples, the seed layer may be may be a sputtered metallic layer, such as, for example, titanium-tungsten/copper (TiW/Cu) or titanium/copper (Ti/Cu). Copper may then be formed over the surface of the reconstituted wafer.

In some example processes, a plating resist layer may be deposited over the seed layer and then patterned in a conventional manner to define the contours for forming the conductive traces of the first layer of the redistribution structure. The copper layer may then be deposited over the exposed portions of the seed layer left exposed by the patterned plating resist. The patterned plating resist may then be removed. As a result of the forming of the conductive elements of the first layer of the redistribution structure, the ends of wires 512, 514 extend into conductive structures, such as micro-vias 546 (or another conductive structure as discussed in reference to FIGS. 2A-C). In the depicted example, the metal structure of the micro-via 546 is formed around at least the end portion of the wires 512, 514. When the wires extend directly to the conductive structure, and the conductive structure is actually formed around the wire, a better connection may be formed, and in some examples the connection will provide lower resistance than other alternatives. One advantage that may exist in some examples from having a wire extend into the region of a micro-via is that the process of forming the opening in the dielectric layer for the micro-via may serve to clean the exposed surface of the wire thereby further enhancing the electrical connection with the conductive micro-via formed around the wire.

Once the conductive structures of the first metal layer are formed, then the remaining portions of the seed layer may be removed by etching. In examples such as that described, wherein the seed layer is either titanium-tungsten/copper (TiW/Cu) or titanium/copper (Ti/Cu), an example suitable chemistry for removing the sputtered copper is nitric acid ($HNO_3$), and an example suitable chemistry for removing the titanium (Ti) or titanium-tungsten (TiW) is hydrogen peroxide ($H_2O_2$) plus ammonium hydroxide ($NH_4OH$).

Figure 5I:
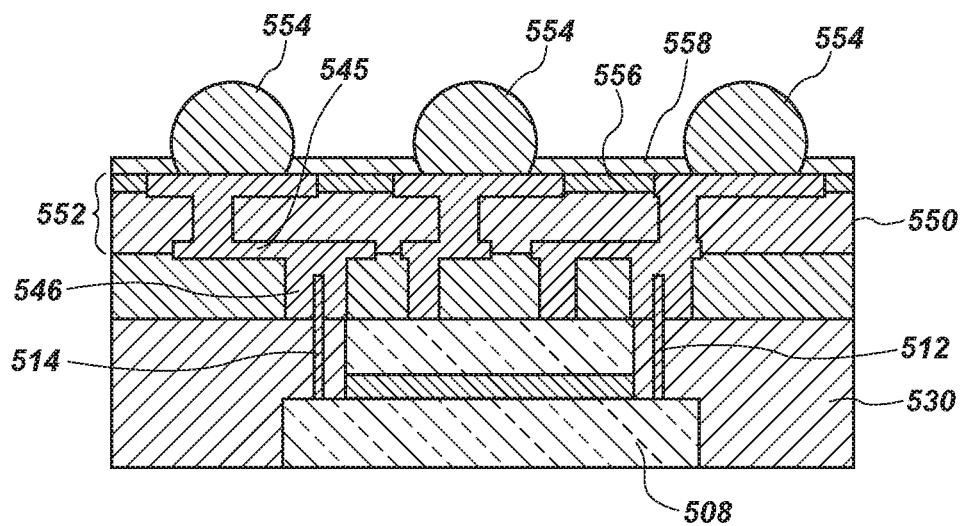

Referring now to FIG. 5I, in this example, which includes first and second layers to the redistribution structure, another dielectric layer 550 may be formed over the conductive structures 546, 548 in the first layer. That layer will then be patterned in the same manner as described above, and metal structures will again be formed in the same manner described above to form the second layer 552 of the redistribution structure. The structure extending between the portions of the conductive structures which need to be exposed may then be isolated with another dielectric material, for example a solder resist coating 556. Contact structures, such as, for example, contact balls 554 (termed "solder balls" without implying any limitation as to the actual material of the structures) may then be formed on individual contacts to establish mechanical and electrical connection of the device with external structures.

In the depicted construction of FIGS. 5H-I, both of wires 512, 514 extend into micro-vias 546 in the first, lower, layer of the multilayer redistribution structure. However, as noted in the example process flow of FIG. 4, an optional structure is to have a first one of the wires extending into the first layer of the conductive structures of the redistribution layer (either into a conductive trace or via), and a second of the wires extending into the second layer of the conductive structures of the redistribution layer or directly into a contact ball (as in FIGS. 2B-C, and discussed in relation thereto).

As noted earlier, many types of semiconductor die may be beneficially packaged together in a microelectronic device in the manner described herein. One example of such a beneficial combination would be a processor die in combination with one or more other devices, such as a memory device, chipset, graphics processor, etc., with one or more of the devices stacked above another and connected with a redistribution structure through use of a wire interconnect as described herein. The resulting stacked die microelectronic device may then be included in a larger electronic device or system, as described below. Such an electronic system, may include another microelectronic device and/or any of the additional components identified in FIG. 6.

Figure 6:
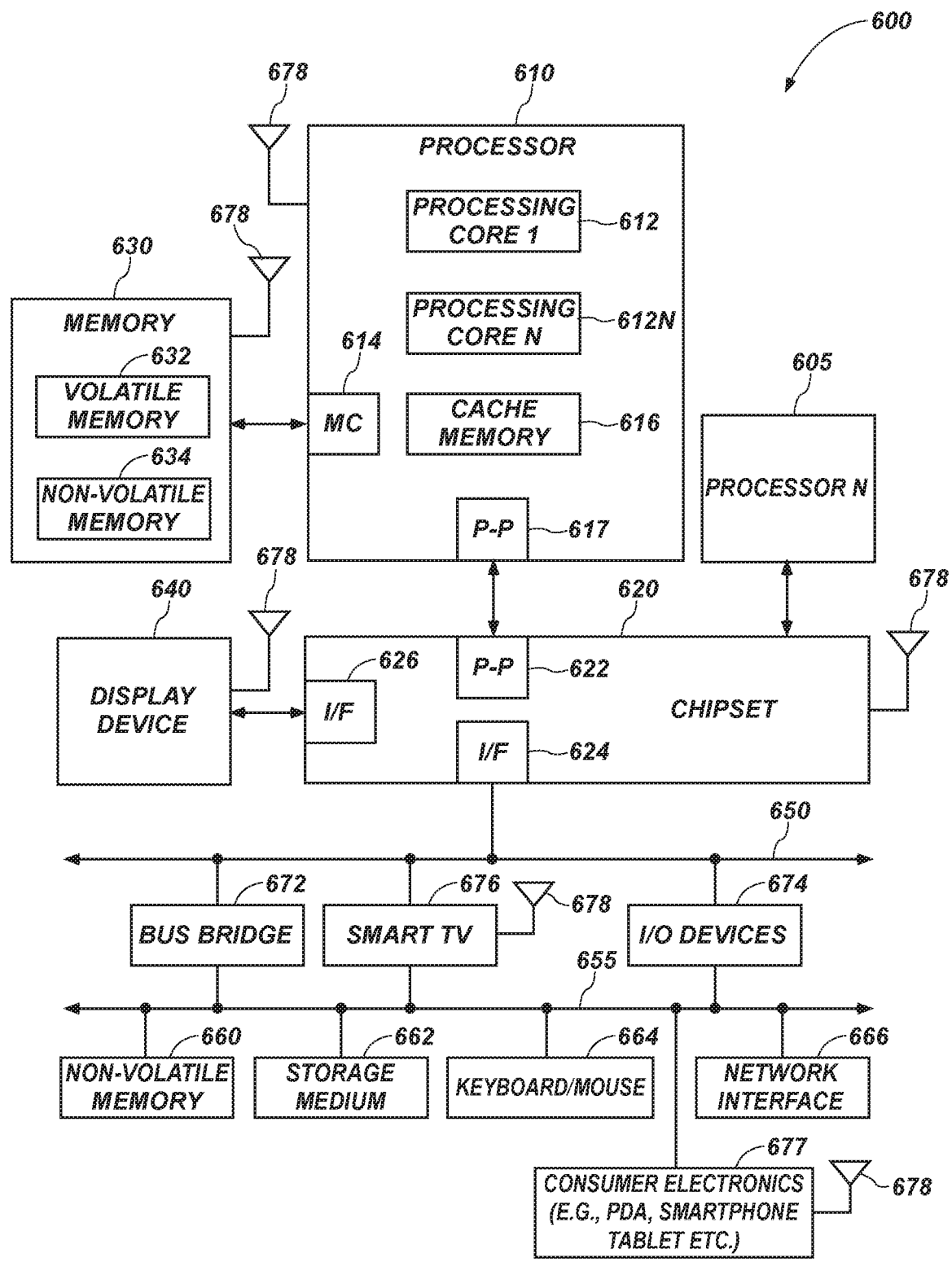
FIG. 6 depicts a system level diagram which may incorporate a microelectronic device such as any of the microelectronic device packages as described herein.

FIG. 6 illustrates a system level diagram, according to one embodiment of the invention. For instance, FIG. 6 depicts an example of an electronic device (e.g., system) including the stacked die microelectronic device with constructed one or more wire interconnects as described in the present disclosure. FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620 couples with a non-volatile memory 660, a mass storage device(s) 662, a keyboard/mouse 664, a network interface 666, a smart TV 676, consumer electronics 677, etc., via interface 624.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the methods and apparatuses described herein, a non-limiting set of example embodiments are set forth below as numerically identified examples.

Example 1 is a microelectronic device, including: a first semiconductor die; a redistribution structure coupled to a first side of the semiconductor die, the redistribution layer including multiple conductive traces and vias formed therein; and a second semiconductor die extending at least partially above the first semiconductor die on the opposite side of the die from the redistribution structure, the second semiconductor die having an active surface facing the redistribution structure, and including one or more wires coupled to the active surface and extending into respective conductive structures of the redistribution structure.

In Example 2, the subject matter of Example 1 where the redistribution structure optionally includes: a first redistribution layer including conductive traces and vias, the first redistribution layer coupled to the first side of the first semiconductor die; and a second redistribution layer including conductive traces and vias, where at least some traces in the first and second redistribution layers are coupled to one another through respective conductive vias.

In Example 3, the subject matter of Example 2 where a first wire of the one or more wires extends into a conductive structure in the first redistribution layer.

In Example 4, the subject matter of any one or more of Examples 2-3 where a first wire of the one or more wires extends into a conductive structure in the second redistribution layer.

In Example 5, the subject matter of any one or more of Examples 1-4 where the redistribution structure further optionally includes multiple contacts configured to engage a support structure.

In Example 6, the subject matter of any one or more of Examples 1-5 where the second semiconductor die optionally includes multiple contact surfaces on the active surface and where each of the one or more wires is coupled to a respective contact surface.

In Example 7, the subject matter of any one or more of Examples 2-6 where a first wire of the one or more wires extends into a conductive structure in the first redistribution layer; and where a second wire of the one or more wires extends into a conductive structure in the second redistribution layer.

In Example 8, the subject matter of any one or more of Examples 1-7 optionally include a third semiconductor die extending on the opposite side of the first semiconductor die from the redistribution structure, the third semiconductor die having an active surface facing the redistribution structure, and including one or more wires coupled to the active surface and extending into respective conductive vias in the redistribution structure.

In Example 9, the subject matter of any one or more of Examples 1-8 optionally include a molded component covering the multiple semiconductor die, and where a portion of the redistribution structure is supported by the molded component.

In Example 10, the subject matter of any one or more of Examples 1-9 where the wires are each wire bonded to respective contact surfaces on the active surface of the second semiconductor die.

In Example 11, the subject matter of any one or more of Examples 1-10 where the multiple contacts of the redistribution structure comprise contact balls.

In Example 12, the subject matter of any one or more of Examples 5-11 optionally include at least one wire extending into respective contact of the multiple contacts configured to engage a support surface.

In Example 13, the subject matter of any one or more of Examples 1-12 optionally include at least one wire extending into a conductive via in the redistribution structure.

In Example 14, the subject matter of any one or more of Examples 1-13 optionally include at least one wire extending into a conductive trace in the redistribution structure.

In Example 15, the subject matter of any one or more of Examples 1-14 where the first semiconductor die is a flip chip die coupled directly to the redistribution structure.

In Example 16, the subject matter of Example 15 optionally includes a third semiconductor die which is also a flip chip die coupled directly to the redistribution structure.

In Example 17, the subject matter of any one or more of Examples 15-16 optionally include a fourth semiconductor die extending at least partially above at least one of the first and third semiconductor die on the opposite side from the redistribution structure, the fourth semiconductor die having an active surface and having one or more wires coupled to the active surface and extending into respective conductive vias in the redistribution structure.

In Example 18, the subject matter of Example 17 optionally includes a fifth semiconductor die extending at least partially above the third semiconductor die on the opposite side from the redistribution structure, the fifth semiconductor die having one or more wires coupled to an active surface of the fifth semiconductor die extending closest to the redistribution structure and extending into respective conductive vias in the redistribution structure.

In Example 19, the subject matter of any one or more of Examples 11-18 where the multiple contacts comprise a ball grid array.

In Example 20, the subject matter of any one or more of Examples 1-19 where the second semiconductor die is secured to the first semiconductor die.

In Example 21, the subject matter of Example 20 where the second semiconductor die is secured to the first semiconductor die through an adhesive layer.

Example 22 is a method of forming a microelectronic device package, including: attaching a first semiconductor die to a carrier through use of an adhesive material layer, with an active surface of the die contacting the adhesive material layer; attaching multiple wires to respective contact surfaces at an active surface of a second semiconductor die, the wires extending from the active surface of the second semiconductor die; placing the second semiconductor die in partially overlapping relation to the first semiconductor die, with the active surface of the second semiconductor die facing the carrier, and the multiple wires extending beyond the first semiconductor die and into the adhesive material layer; forming a molded component around the first and second semiconductor die; removing the adhesive material layer; and forming a redistribution structure supported by the first semiconductor die and the molded component, the redistribution structure having multiple conductive traces and vias formed therein, the redistribution structure formed with conductive structures surrounding the wires extending from the second semiconductor die.

In Example 23, the subject matter of Example 22 where the first semiconductor die is a flip chip die coupled directly to the redistribution structure.

In Example 24, the subject matter of any one or more of Examples 22-23 where attaching multiple wires to respective contacts optionally includes attaching the wires to extend generally linearly from the respective contact.

In Example 25, the subject matter of any one or more of Examples 22-24 where the redistribution structure optionally includes contact balls arranged to contact a structure external to the microelectronic device package.

In Example 26, the subject matter of any one or more of Examples 22-25 where attaching the multiple wires to the respective contacts of the second semiconductor die optionally includes wire bonding the wires to the contacts.

In Example 27, the subject matter of any one or more of Examples 22-26 optionally include attaching the second semiconductor die to the first semiconductor die before forming the molded component around the first and second semiconductor die.

In Example 28, the subject matter of any one or more of Examples 22-27 where forming the redistribution structure optionally includes: forming a first redistribution layer of conductive traces and vias within a dielectric, the first redistribution layer extending proximate the first semiconductor die; and forming a second redistribution layer of conductive traces and vias within a dielectric, where at least some traces in the first and second layers are coupled to one another through conductive vias.

In Example 29, the subject matter of Example 28 where a first wire of the multiple wires extending from the active surface of the second semiconductor die extends into a conductive structure in the first redistribution layer.

In Example 30, the subject matter of Example 29 where forming the redistribution structure optionally includes depositing metal of the first redistribution layer around the first wire.

In Example 31, the subject matter of any one or more of Examples 28-30 where a first wire of the multiple wires extending from the active surface of the second semiconductor die extends into a conductive structure in the second redistribution layer.

In Example 32, the subject matter of Example 31 where forming the redistribution structure optionally includes depositing metal of the second redistribution layer around the first wire.

In Example 33, the subject matter of any one or more of Examples 25-32 where a first wire of the multiple wires extending from the active surface of the second semiconductor die extends into a contact ball of the redistribution structure.

In Example 34, the subject matter of Example 33 where forming the redistribution structure optionally includes forming the contact ball of the redistribution structure around the first wire.

In Example 35, the subject matter of any one or more of Examples 28-34 where forming the redistribution structure optionally includes: depositing metal of a conductive via of the first redistribution layer around a first wire of the multiple wires extending from the active surface of the second semiconductor die; and depositing metal of a conductive via of the second redistribution layer around a second wire of the multiple wires extending from the active surface of the second semiconductor die.

In Example 36, the subject matter of any one or more of Examples 22-35 optionally include attaching multiple wires to respective contacts on an active surface of a third semiconductor die, the wires extending from the active surface of the third semiconductor die; and placing the third semiconductor die in partially overlapping relation to the first semiconductor die, with the active surface of the third semiconductor die facing the carrier, and the multiple wires extending from the third semiconductor die extending beyond the first semiconductor die and into the adhesive material layer.

In Example 37, the subject matter of any one or more of Examples 22-36 optionally include attaching a third die, which is a flip chip die, to the carrier through use of the adhesive material layer, with an active surface of the third die contacting the adhesive material layer.

In Example 38, the subject matter of Example 37 where the second semiconductor die extends partially over the first semiconductor die and partially over the third semiconductor die.

In Example 39, the subject matter of any one or more of Examples 37-38 optionally include attaching multiple wires to respective contacts on an active surface of a fourth semiconductor die, the wires extending from the active surface of the fourth semiconductor die; and placing the fourth semiconductor die in partially overlapping relation to the third semiconductor die, with the active surface of the fourth semiconductor die facing the carrier, and the attached multiple wires extending from the fourth semiconductor die extending beyond the third semiconductor die and into the adhesive material layer.

In Example 40, the subject matter of Example 39 optionally includes attaching multiple wires to respective contacts on an active surface of a fifth semiconductor die, the wires extending from the active surface of the fifth semiconductor die; and placing the fifth semiconductor die in partially overlapping relation to at least one of the first and third semiconductor die, with the active surface of the fifth semiconductor die facing the carrier, and the attached multiple wires extending from the fifth semiconductor die extending beyond the first and third semiconductor die and into the adhesive material layer.

In Example 41, the subject matter of any one or more of Examples 22-40 optionally include back grinding the molded component to reduce the height of the package.

In Example 42, the subject matter of Example 41 where the back grinding removes at least a portion of the second semiconductor die.

In Example 43, the subject matter of any one or more of Examples 22-42 where the wires extend generally perpendicularly from the semiconductor die to which they are attached.

In Example 44, the subject matter of any one or more of Examples 22-43 optionally include after forming of the molded component, and before forming of the redistribution structure, removing the molded structure from the carrier.

In Example 45, the subject matter of Example 44 optionally includes after forming of the molded component, attaching a second carrier to the side of the encapsulated assembly opposite the extending wires.

Example 46 is an electronic system, including: a microelectronic device, including a first semiconductor die; a redistribution structure coupled to a first side of the semiconductor die, the redistribution layer having multiple conductive traces and vias formed therein; and a second semiconductor die extending at least partially above the first semiconductor die on the opposite side of the die from the redistribution structure, the second semiconductor die having one or more wires coupled to an active surface of the second semiconductor die extending closest to the redistribution structure, the one or more wires extending beyond a proximal surface of the redistribution structure and into respective conductive structures in the redistribution structure; and at least one of another microelectronic device, a mass storage device and a network interface operably coupled to the microelectronic device.

In Example 47, the subject matter of Example 46 where the redistribution structure optionally includes: a first redistribution layer including conductive traces and vias, the first redistribution layer extending proximate the first semiconductor die; and a second redistribution layer including conductive traces and vias, where at least some traces in the first and second redistribution layers are coupled to one another through conductive vias.

In Example 48, the subject matter of Example 47 where a first wire of the one or more wires extending from the active surface of the second semiconductor die extends into a conductive structure in the first redistribution layer; and where a second wire of the one or more wires extending from the active surface of the second semiconductor die extends into a conductive structure in the second redistribution layer.

In Example 49, the subject matter of any one or more of Examples 46-48 optionally include a third semiconductor die extending at least partially above the first semiconductor die on the opposite side from the redistribution structure, the third semiconductor die having one or more wires coupled to an active surface of the third semiconductor die extending closest to the redistribution structure, and extending into respective conductive structures in the redistribution structure.

In Example 50, the subject matter of any one or more of Examples 46-49 optionally include a molded component covering the semiconductor die, where a portion of the redistribution structure is supported by the molded component.

In Example 51, the subject matter of any one or more of Examples 46-50 where the wires are each wire bonded to respective contact surfaces on the active surface of the second semiconductor die.

In Example 52, the subject matter of any one or more of Examples 46-51 where the redistribution structure further optionally includes multiple contacts configured to engage a support structure.

In Example 53, the subject matter of any one or more of Examples 46-52 where the first semiconductor die is a flip chip die coupled directly to the redistribution structure.

In Example 54, the subject matter of Example 53 optionally includes a third semiconductor die which is also a flip chip die coupled directly to the redistribution structure.

In Example 55, the subject matter of Example 54 optionally includes a fourth semiconductor die extending at least partially above at least one of the first and third semiconductor die on the opposite side from the redistribution structure, the fourth semiconductor die having an active surface and having one or more wires coupled to the active surface and extending into respective conductive vias in the redistribution structure.

In Example 56, the subject matter of Example 55 optionally includes a fifth semiconductor die extending at least partially above the third semiconductor die on the opposite side from the redistribution structure, the fifth semiconductor die having one or more wires coupled to an active surface of the fifth semiconductor die extending closest to the redistribution structure and extending into respective conductive vias in the redistribution structure.

In Example 57, the subject matter of any one or more of Examples 52-56 where the multiple contacts comprise a ball grid array.

In Example 58, the subject matter of any one or more of Examples 46-57 where the second semiconductor die is secured to the first semiconductor die.

In Example 59, the subject matter of Example 58 where the second semiconductor die is secured to the first semiconductor die through an adhesive layer.

In Example 60, the subject matter of any one or more of Examples 46-59 optionally include at least one wire extending into a respective contact of the multiple contacts configured to engage a support surface.

In Example 61, the subject matter of any one or more of Examples 46-60 optionally include at least one wire extending into a conductive via in the redistribution structure.

In Example 62, the subject matter of any one or more of Examples 46-61 optionally include at least one wire extending into a conductive trace in the redistribution structure.

In example 63, the subject matter of any of Examples 46-61, including a microelectronic device including any of the structures identified in one or more of Examples 1-21.

In example 64, the subject matter of any of Examples 46-61, including a microelectronic device manufactured in accordance with any of the methods set forth in Examples 22-45.

In example 65, a microelectronic device having a structure in accordance with any one or more of Examples 1-45.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

We claim:

1. A microelectronic device, comprising:
   a first semiconductor die;
   a redistribution structure coupled to a first side of the semiconductor die, the redistribution structure including multiple conductive traces and vias formed therein; and
   a second semiconductor die extending at least partially above the first semiconductor die on the opposite side of the die from the redistribution structure, the second semiconductor die having an active surface facing the redistribution structure, and including one or more wires coupled to the active surface and extending away from the conductive surface and into respective conductive structures of the redistribution structure.

2. The microelectronic device of claim 1, wherein the redistribution structure comprises:
   a first redistribution layer including conductive traces and vias, the first redistribution layer coupled to the first side of the first semiconductor die; and
   a second redistribution layer including conductive traces and vias, wherein at least some traces in the first and second redistribution layers are coupled to one another through respective conductive vias.

3. The microelectronic device of claim 2, wherein a first wire of the one or more wires extends into a conductive structure in the first redistribution layer.

4. The microelectronic device of claim 2, wherein a first wire of the one or more wires extends into a conductive structure in the second redistribution layer.

5. The microelectronic device of claim 1, wherein the redistribution structure further comprises multiple contacts configured to engage a support structure.

6. The microelectronic device of claim 1, wherein the second semiconductor die comprises multiple contact surfaces on the active surface and wherein each of the one or more wires is coupled to a respective contact surface.

7. The microelectronic device of claim 2:
   wherein a first wire of the one or more wires extends into a conductive structure in the first redistribution layer; and
   wherein a second wire of the one or more wires extends into a conductive structure in the second redistribution layer.

8. The microelectronic device of claim 1, further comprising:
   a third semiconductor die extending on the opposite side of the first semiconductor die from the redistribution structure, the third semiconductor die having multiple contact surfaces on an active surface facing the redistribution structure, and including one or more wires coupled to the active surface and extending into respective conductive vias in the redistribution structure.

9. The microelectronic device of claim 1, further comprising:
   a molded component covering the multiple semiconductor die, and
   wherein a portion of the redistribution structure is supported by the molded component.

10. The microelectronic device of claim 1, wherein the active surface comprises multiple contact surfaces, and wherein the wires are each wire bonded to respective contact surfaces on the active surface of the second semiconductor die.

11. The microelectronic device of claim 1, wherein the multiple contacts of the redistribution structure comprise contact balls.

12. The microelectronic device of claim 5, comprising at least one wire extending into respective contact of the multiple contacts configured to engage a support surface.

13. The microelectronic device of claim 1, comprising at least one wire extending into a conductive via in the redistribution structure.

14. The microelectronic device of claim 1, comprising at least one wire extending into a conductive trace in the redistribution structure.

15. The microelectronic device of claim 1, wherein the first semiconductor die is a flip chip die coupled directly to the redistribution structure.

16. A method of forming a microelectronic device package, comprising:
   attaching a first semiconductor die to a carrier through use of an adhesive material layer, with an active surface of the die contacting the adhesive material layer;
   attaching multiple wires to respective contact surfaces at an active surface of a second semiconductor die, the wires extending from the active surface of the second semiconductor die;
   placing the second semiconductor die in partially overlapping relation to the first semiconductor die, with the active surface of the second semiconductor die facing the carrier, and the multiple wires extending beyond the first semiconductor die and into the adhesive material layer;
   forming a molded component around the first and second semiconductor die;
   removing the adhesive material layer; and
   forming a redistribution structure supported by the first semiconductor die and the molded component, the redistribution structure having multiple conductive traces and vias formed therein, the redistribution structure formed with conductive structures surrounding the wires extending from the second semiconductor die.

17. The method of claim 16, wherein the first semiconductor die is a flip chip die coupled directly to the redistribution structure.

18. The method of claim 16, wherein the redistribution structure comprises contact balls arranged to contact a structure external to the microelectronic device package.

19. The method of claim 16, wherein attaching the multiple wires to the respective contacts of the second semiconductor die comprises wire bonding the wires to the contacts.

20. The method of claim 16, wherein forming the redistribution structure comprises:
   forming a first redistribution layer of conductive traces and vias within a dielectric, the first redistribution layer extending proximate the first semiconductor die; and
   forming a second redistribution layer of conductive traces and vias within a dielectric, wherein at least some traces in the first and second layers are coupled to one another through conductive vias.

21. The method of claim 20, wherein a first wire of the multiple wires extending from the active surface of the second semiconductor die extends into a conductive structure in the first redistribution layer.

22. The method of claim 20, wherein a first wire of the multiple wires extending from the active surface of the second semiconductor die extends into a conductive structure in the second redistribution layer.

23. The method of claim 22, wherein forming the redistribution structure comprises depositing metal of the second redistribution layer around the first wire.

24. An electronic system, comprising:
a microelectronic device, comprising,
a first semiconductor die;
a redistribution structure coupled to a first side of the semiconductor die, the redistribution structure having multiple conductive traces and vias formed therein; and
a second semiconductor die extending at least partially above the first semiconductor die on the opposite side of the die from the redistribution structure, the second semiconductor die having one or more wires coupled to an active surface of the second semiconductor die extending closest to the redistribution structure, the one or more wires extending beyond a proximal surface of the redistribution structure and into respective conductive structures in the redistribution structure; and
at least one of another microelectronic device, a mass storage device and a network interface operably coupled to the microelectronic device.

25. The microelectronic device of claim 24, comprising at least one wire extending into a conductive via in the redistribution structure.

* * * * *